(12) United States Patent
Duncan et al.

(10) Patent No.: US 9,753,445 B1
(45) Date of Patent: Sep. 5, 2017

(54) DUT CONTINUITY TEST WITH ONLY DIGITAL IO STRUCTURES APPARATUS AND METHODS ASSOCIATED THEREOF

(71) Applicant: The United States of America as represented by the Secretary of the Navy, Washington, DC (US)

(72) Inventors: Adam Duncan, Bloomington, IN (US); Matthew Gadlage, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/593,621

(22) Filed: May 12, 2017

Related U.S. Application Data

(62) Division of application No. 14/554,954, filed on Nov. 26, 2014, now Pat. No. 9,684,025.

(60) Provisional application No. 61/909,093, filed on Nov. 26, 2013.

(51) Int. Cl.
```
G01R 31/02      (2006.01)
G05B 19/042     (2006.01)
G06F 13/38      (2006.01)
G01R 31/3167    (2006.01)
```

(52) U.S. Cl.
CPC ....... *G05B 19/0423* (2013.01); *G01R 31/024* (2013.01); *G01R 31/3167* (2013.01); *G06F 13/385* (2013.01); *G05B 2219/21114* (2013.01)

(58) Field of Classification Search
CPC ............ H05B 37/0272; H05B 37/0227; H05B 33/0854; H05B 33/0803; H05B 33/0845; H05B 37/0281; H05B 37/0218; H05B 37/03; G01R 31/11; G01R 31/008; G01R 31/021; G01R 31/024; H02J 9/065; H02J 9/02
USPC ........................................................ 324/533
See application file for complete search history.

(56) References Cited

U.S. PATENT DOCUMENTS

| | | | | |
|---|---|---|---|---|
| 4,970,466 A | * | 11/1990 | Bolles | G01R 31/11 324/533 |
| 7,135,873 B2 | * | 11/2006 | McCosh | G01B 11/024 324/533 |
| 8,614,585 B2 | * | 12/2013 | Wang | G01R 27/04 324/322 |
| 2005/0052190 A1 | * | 3/2005 | McCosh | G01B 11/024 324/644 |

(Continued)

*Primary Examiner* — Alesa Allgood
(74) *Attorney, Agent, or Firm* — Christopher A Monsey

(57) ABSTRACT

A method and system for determining short, open, and good connections using digital input and output (TO) structures in a device under test (DUT) continuity test, through the combined methods of using resistance-capacitance (RC) delay, time domain reflectometry (TDR), and forcing voltage on to a single IO pin of the DUT while measuring voltage on remaining IO pins of said DUT. In one embodiment, the combined methods are executed without the DUT in a test socket to produce a first set of test values and also with the DUT in a test socket to produce a second set of test values. The first and second sets of test values are compared to determine if one or more circuits of the DUT have a short circuit, an open circuit, or are a good (have an electrical connection that is not a short circuit or an open circuit) circuit.

17 Claims, 14 Drawing Sheets

(56) References Cited

U.S. PATENT DOCUMENTS

2007/0075710 A1\* 4/2007 Hargreaves ........ G01R 27/2605
324/658
2008/0052028 A1 2/2008 Pickerd
2014/0183946 A1 7/2014 Recker \* cited by examiner 111 — Provide a Test System 10 including DUT Interface Board (test setup) 8, a Tester 3 including a first plurality of input/output (IO) pins programmably coupled to a DUT connector or interface on the DUT Interface Board 8 comprising a second plurality of IO pins, where the DUT connector or interface is adapted to electrically interface with a DUT 4 IO pins 113 — Couple the first plurality of IO pins of the Tester 3 to the second plurality of I/O pins of the DUT connector or interface on the DUT Interface Board (test setup) 8 without a DUT 4 installed therein, said couple step can be executed by a switching matrix of Tester 3

115 — Place one, all, or some of Tester 3 first plurality of IO pins (n), e.g. with switching matrix (e.g., FPGA) configuration settings, in a high-impedance state 117 — Configuring a first selected tester IO pin of said first plurality of IO pins (correlated to a first DUT IO pin when DUT 4 is inserted into the DUT Interface Board 5 and coupled with Tester 3) as tester output driving logic high by, e.g., Tester 3 switch matrix (E.g., FPGA) configuration settings;

119 — Configuring the first selected tester I/O pin in a high-impedance state for a first time increment, e.g., a shortest increment possible (this begins RC delay from a correlated DUT I/O pin); e.g., by FPGA configuration settings by applying a voltage then disconnecting the voltage supply and allowing the voltage on the pin to dissipate 121 — Configuring the first selected tester I/O pin as a tester input sampling at a first sample rate, e.g., a highest reliable sample rate (80MHz to 320MHz is typical in FPGA-based test system) and commencing recording a first sample count number (e.g. by FPGA logic, configuration settings)

123 — While steps 119 and 121 are executed, continually sampling the first selected tester I/O pin and incrementing the first sample count number until a logic low is recorded (e.g., a logic low can be typically recorded when tester pin is less than 50% of logic high value, e.g. if logic high is set to 3V, sample count until 1.5 V)

FIG. 3a

201 — Providing a Testing System 10 (e.g., as in Fig. 1) including a Tester 3 comprising a first plurality of IO pins, a DUT Interface Board (test setup) 8 comprising a second plurality of IO pins on a DUT connector or interface configured to selectively receive and interface with a third plurality of IO pins on a DUT 4 that are programmably coupled to the first plurality of IO pins by the Tester 3

203 — Tester 3 places all of said first plurality of Tester 3 IO pins (n) in a high impedance state without the DUT 4 coupled to said DUT connector or interface 205 — Tester 3 configures a first Tester 3 IO pin of the first plurality IO pins (connected to a first DUT connector or interface IO pin of the second plurality of IO pins) as a Tester 3 output driving logic high, e.g. 3V 207 — Tester 3 configures the first Tester 3 IO pin of the first plurality of IO pins as tester output driving logic low to introduce a negative edge signal, e.g. 0 V to.

209 — Tester 3 configures the first tester IO pin in a high-impedance state for a predetermined time increment (e.g., shortest time increment possible)

211 — First tester IO pin is configured as tester input sampling at highest reliable sample rate and a first sample count is recorded in non-transitory computer storage readable medium 7

213 — During steps 209 and 211, the first tester IO pin is continually sampled at a predetermined sample rate (e.g., a highest reliable sample rate) for a predetermined time period (e.g., enough time for reflection to propagate from Tester 3 to DUT 4 and back to Tester 3 one or more times based on detecting an increased voltage after time zero) to generate a first plurality of samples 215 — Store the first plurality of samples sample values into non-transitory computer storage readable medium 7 for future comparison

FIG. 5a

217 — Repeat steps 205 to 215 until all Tester 3 IO pins (e.g., first plurality of IO pins) connected to DUT 4 IO pins (e.g., third plurality of IO pins) have been characterized and store additional first plurality of sample values in a non-transitory computer storage readable medium 7

219 — Repeat steps 205 to 217 a predetermined number of times to determine a range of the first plurality of samples for each Tester 3 IO pin (e.g., first plurality of IO pins) and DUT 4 IO pin (e.g., third plurality of IP pins) pair which will represent an open circuit between the tester IO and the DUT IO pin pair 221 — Insert DUT 4 into DUT Interface Board (test setup) 8 and steps 205 to 217 are repeated to create a second plurality of samples 223 — Compare the first and second plurality of sample values for each tester IO and DUT IO pin pair to determine if the presence of DUT 4 has changed a recorded pattern for each pair, wherein if presence of DUT 4 has changed one or more of the recorded pattern of a respective said pair and there are more '1' values recorded, then an open circuit in DUT continuity is detected and DUT 4 should be reseated and this method should be repeated;

if presence of DUT 4 has changed a recorded pattern for one or more of each pair and there are less '1' values recorded, then either a short or good connection is likely on such a pair, and the method in FIG. 7 should be applied next;

if presence of DUT 4 has not changed a recorded pattern for one or more of each pair and the recorded pattern includes '1' values, an open circuit in DUT continuity is likely and the DUT 4 should be reseated and this method should be repeated;

if presence of DUT 4 has not changed a recorded pattern for one or more of each pair and the recorded pattern does not include '1' values, either a short or good connection is likely and the method in FIG. 7 should be applied.

FIG. 5b

301 — Providing a Test System 10 (e.g., as in fig. 1) comprising a control section and a first plurality of IO pins and a DUT Interface Board (test setup) 8 comprising a DUT interface or connector comprising a second plurality of IO pins then inserting a DUT 4 comprising a third plurality of IO pins into the DUT interface or connector wherein the Tester 8 programmably couples the first and second plurality of IO pins 303 — Once DUT 4 is inserted into the DUT interface or connector on the DUT Interface Board (test setup) 8, all Tester 3 IO pins (e.g., first plurality of IO pins) are configured as tester output driving low (e.g., a "0" value below a predetermined voltage threshold) to discharge all the Tester 3 IO pins 305 — Place all Tester 3 IO pins (n) (e.g., first plurality of IO pins) on Tester 3 in a high-impedance state 307 — Configure a first Tester 3 IO pin of said first plurality of IO pins that is connected to a first DUT interface or connector IO pin of said second plurality of IO pins as tester output driving logic high (e.g., a "1" value above the predetermined voltage threshold)

309 — Configure a next adjacent said Tester 3 IO pin of said first plurality of IO pins as a tester input sampling at a predetermined sample rate (e.g., a highest reliable sample rate) and record one of a first plurality of sample values of pin driven high and pin sampled in a non-transitory computer storage readable medium 7

311 — Repeat step 309 for each adjacent said Tester 3 IO pin of said first plurality of IO pins and generate additional first plurality of sample values respective to each Tester 3 IO pin of said first plurality of IO pins

FIG. 7a

313 — Repeat steps 301 to 311 until all adjacent Tester 3 IO pins of said first plurality of IP pins connected to the DUT interface connector IO pins (e.g., the second plurality of IO pins) have been sampled, characterized and respective ones of said first plurality of data has been recorded in non-transitory computer storage readable medium 7, said recorded values comprising a "1" or "0" representing a voltage above and below a voltage threshold 315 — If any said adjacent first plurality of pins have recorded '1' values, a likely short circuit in DUT 4 continuity has been detected and the DUT 4 should be reseated in the DUT interface or connector of the DUT Interface Board (test setup) 8 and method in Figs. 3a-3b repeated 317 — If one or more said adjacent first plurality of IO pins programmably coupled to said second and third plurality of IO pins respectively have no recorded '1' values, either a good or open connection is likely and no errors in DUT continuity were found

FIG. 7b

DUT CONTINUITY TEST WITH ONLY DIGITAL IO STRUCTURES APPARATUS AND METHODS ASSOCIATED THEREOF

CROSS-REFERENCE TO RELATED APPLICATIONS

The present application is a divisional to and claims priority to U.S. patent application Ser. No. 14/554,954, filed Nov. 26, 2014, entitled "DUT CONTINUITY TEST WITH ONLY DIGITAL IO STRUCTURES APPARATUS AND METHODS ASSOCIATED THEREOF", and the present application claims priority to U.S. Provisional Patent Application Ser. No. 61/909,093, filed Nov. 26, 2013, entitled "DUT CONTINUITY TEST WITH ONLY DIGITAL IO STRUCTURES AND METHODS THEREOF," the disclosures of which are expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,240) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

A need exists for a continuity testing system that uses digital input and output structures ("IO") without the need for an adjustable current source and analog voltage measurement. Typical testing systems rely on analog voltage measurements and adjustable current sources. Such systems are limited and do not meet the needs of having a digital system in two ways. First, the current sourcing equipment and analog voltage measurement equipment needs to be built in to the test system in order to complete the measurement. Second, non-standard IO structures that do not include an electrostatic discharge ("ESD") diode are not compatible.

According to an illustrative embodiment, the present invention relates to a computer implemented method and system for determining electrical connections for open and short circuits using digital IO structures without the application of current source and obtaining a precise voltage measurement in the device under test ("DUT"), wherein one short circuit check comprises forcing voltage on a single pin while measuring voltage on remaining pins and open circuit check comprises of either (a) measuring resistance-capacitance ("RC") delay on DUT IO; or (b) using time domain reflectometry ("TDR") or a combination of both.

Another embodiment of the present disclosure provides a non-transitory computer readable medium storing code for controlling a testing system to perform one of several predetermined tests to determine DUT continuity. The code includes instructions for measuring RC delay on DUT IO in order to determine open circuits, measuring time domain reflections for the DUT and testing system and comparing the differences to determine open circuits, and measuring voltage on remaining pins while forcing voltage onto a single pin in order to determine short circuits.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIGS. 3a and 3b show a process of an exemplary method for identifying open circuits by measuring RC delay on DUT IO;

FIGS. 5a and 5b show a process of an exemplary method for identifying open circuits using time domain reflectometry;

FIGS. 7a and 7b show a process of an exemplary method for identifying short circuits by forcing voltage on a single pin while measuring voltage in remaining pins;

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

An exemplary embodiment of the invention can relate to a computer implemented system and method for testing continuity of a DUT with only digital IO structures. A system and method could be built into a testing system in order to determine an incorrect electrical connection with a DUT in a test system, which is an increasing possibility as the microelectronics industry creates smaller geometry DUT package sizes and increasing pin counts.

Figure 1:
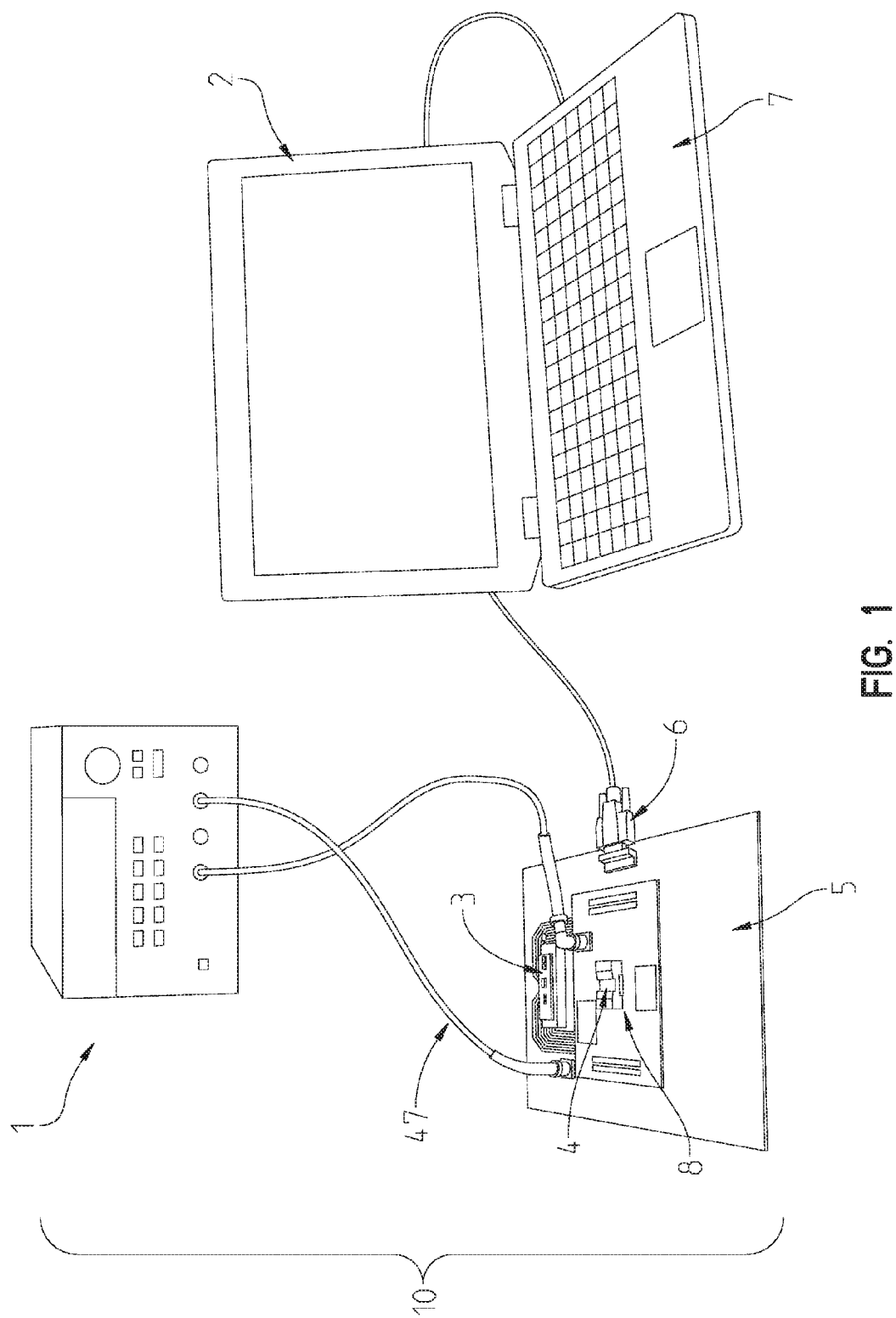
FIG. 1 shows an exemplary testing system setup in accordance with one embodiment of the invention.

Referring initially to FIG. 1, a system configured to test and report on continuity of a DUT 4 is shown. An exemplary embodiment of a test system 10 includes a Tester 3, a DUT 4, and a DUT Interface Board (test setup) 8 that selectively receives and couples with both the DUT 4 and the Tester 3 with different connectors such as plug-in or socket interface bus sections. The DUT Interface Board is coupled to plug-in interface buses on a DUT Adapter Board 5. The Tester 3 interfaces with the DUT Board Cables 47 supply power to test system 10 from power supply 1 and is connected to DUT Adapter Board 5. In this exemplar Tester 3, Tester 3 components include a field programmable gate array (FPGA), IO section comprising a number of pins or interfaces (e.g., dual-inline package or DIP, pin-header connections, etc.), a crystal oscillator, programmable read only memory (PROM) that stores a default set of settings and programs that the FPGA receives and runs from a startup state, an interface section operable to receive and convey instructions and settings that are loaded onto the FPGA for test or other operations of the Tester 3, voltage regulators, voltage level shifting integrated circuits (ICs), resistors, capacitors, diodes, inductors, etc. required to provide stimulus to the DUT and sample DUT response then compare those responses with known good response and determine errors then generate test data outputs to a user or system operable to receive outputs such as a testing interface computer. An RS-232 PC connection 6 is coupled to DUT Adapter Board 5 and transmits output information from DUT Adapter Board 5 to a testing interface computer 2. RS-232 PC connection 6 is also coupled to a non-transitory computer storage readable medium 7 such that information from DUT board can be stored in non-transitory computer storage readable medium 7.

Figure 2:
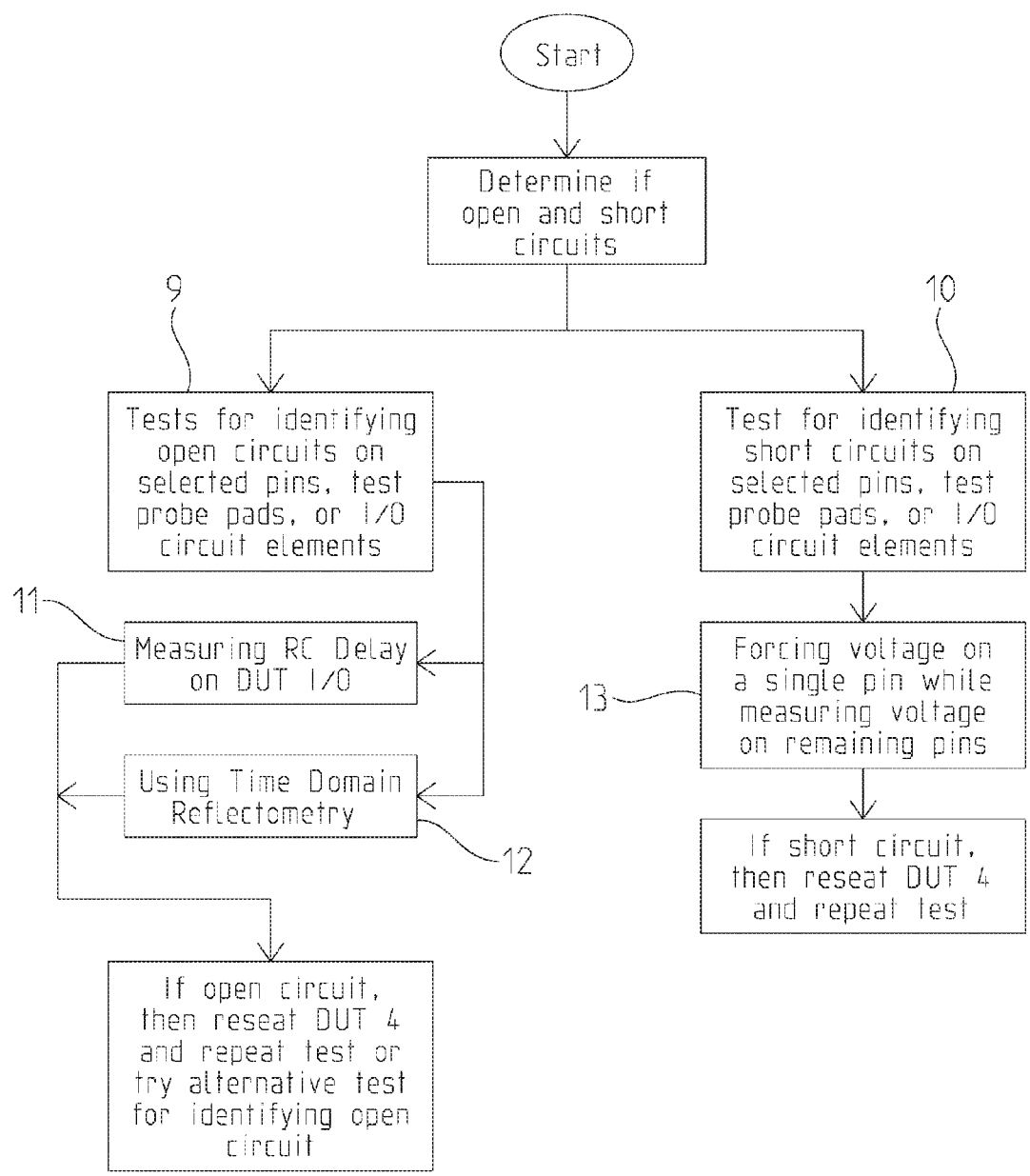
FIG. 2 shows testing options of an exemplary method of testing DUT continuity in accordance with an embodiment of the invention.

Referring to FIG. 2, testing options of an exemplary method of testing DUT continuity in accordance with an embodiment of the invention are shown. To test for identifying open circuits 9, there are various exemplary methods provided. One method 11 is measuring the RC delay on a DUT IO with and without a DUT installed in the DUT. A second method 12 uses TDR to determine if an open circuit is present. If an open circuit is detected, then DUT 4 needs to be reseated and various methods (one or several) described herein (see below) should be repeated for an open circuit.

Two tests for identifying short circuits various apparatus and methods are provided herein. One method involves forcing voltage on a single pin while measuring voltage on remaining pins. If a short circuit is detected from forcing voltage method 13 (FIG. 3a-b), then DUT 4 needs to be reseated and method 13 needs to be conducted again. Methods 11 (RC Delay), 12 (TDR), and 13 (forcing voltage on a pin) are described in greater detail below with respect to FIGS. 3a-b, 5a-b, and FIGS. 7a-b.

One test or a combination of tests can be run to determine open circuits with a test for short circuits, and the combination of tests can be run in any order. In other words, method 11 can be conducted followed by method 13 to test for open and short circuits. Similarly, method 12 can be conducted followed by method 13 to test for open and short circuits.

Tester 3 contains testing protocol data files that operate sections of the Tester 3 (e.g., an FPGA) to direct tests for determining DUT continuity in accordance with embodiments of the invention. Testing protocol data files can include instructions for completing multiple tests including: measuring RC delay on DUT IO (with and without a DUT installed and coupled with the DUT IO) to determine open circuits 11 to generate two sets of RC delay test results; measuring TDR for DUT and testing system (with and without a DUT installed and coupled with DUT IO) to generate two sets of TDR test result sets and comparing the differences in test set results to determine open circuits 12; and measuring voltage on remaining pins while forcing voltage onto a single pin in order to determine short circuits 13 (with and without a DUT installed and coupled with DUT IO) to generate two sets of test result sets then comparing them.

Prior to applying tests for identifying either open circuits or short circuits, a sample rate must be selected and DUT 4 must be calibrated to create a profile. In one embodiment, to select a sample rate, select fastest possible sample rate that a source can provide. A datasheet can be used to determine maximum frequency for signals. Determine if any negative effects (i.e. too much power consumption, too much heat generation, lifetime degradation of sample rate source) exists using sample rate. Determine whether sample rate is sufficient to sample signals in tests to be performed.

Figure 3B:
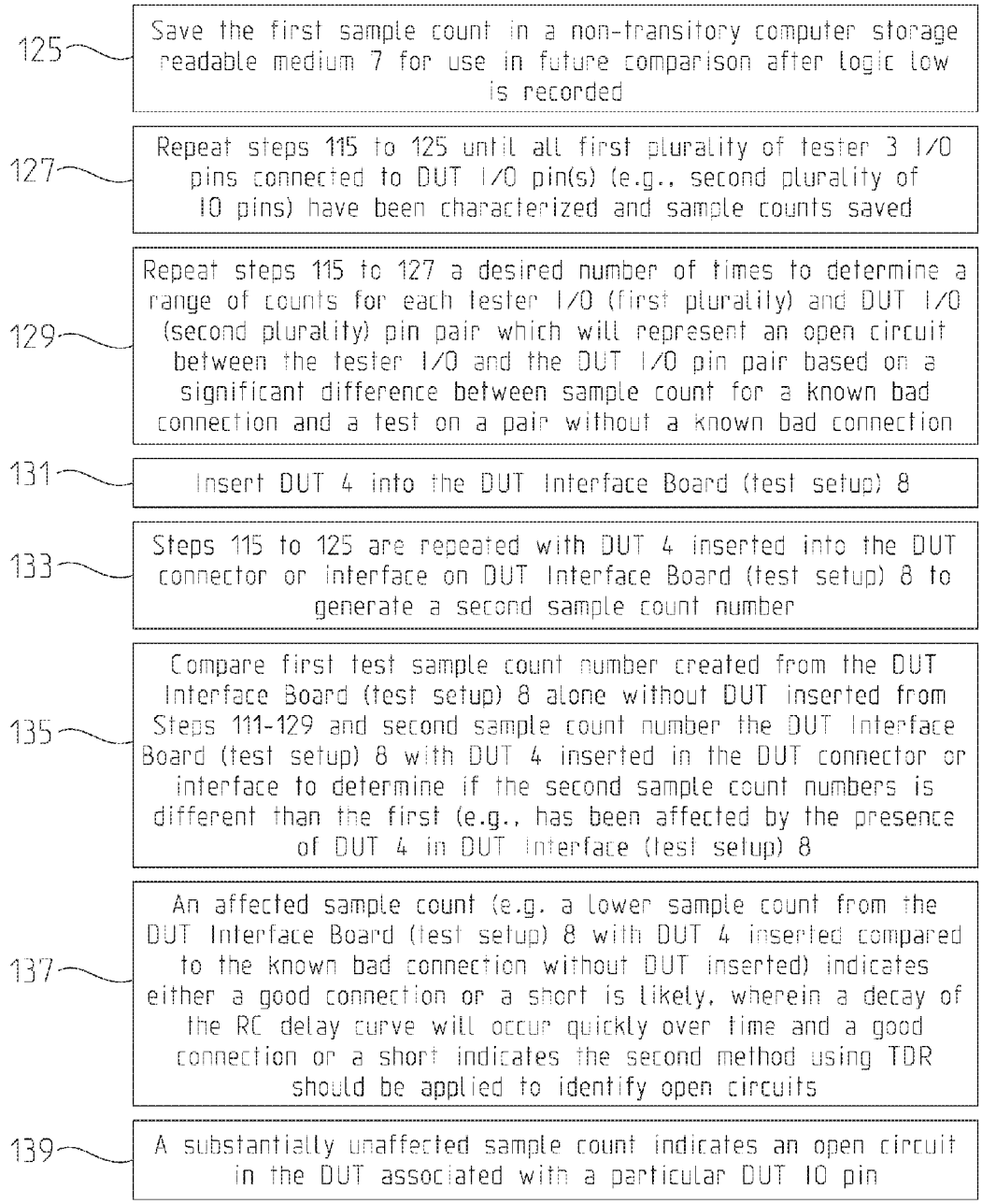

Referring to FIGS. 3a and 3b, a method of identifying open circuits by measuring RC delay on DUT IO elements in accordance with an embodiment of the invention. In general, an embodiment of an RC delay on DUT IO elements can a include a first step of incrementally charging or applying a charge above a threshold (e.g., logic or voltage high) on a DUT socket IO pins without a DUT installed in the DUT socket then sampling RC signals at the sample rate determined above until a subsequent sample falls below the threshold then recording a number of samples taken to generate a first RC delay sample dataset; repeating the first step with a DUT installed in the DUT socket and recording a number of samples taken to generate a second RC delay sample dataset; comparing the first and second RC delay sample dataset and determining an open circuit based on a match or no match of numbers of samples between the first and second RC delay datasets (or a plus/minus match e.g., a match will be determined if the first and second sample numbers are plus or minus e. g., ten percent between numbers of samples in the first and second RC delay datasets). In particular, an exemplary method can include providing a Test System 10 including DUT Interface Board (test setup) 8, a Tester 3 including a first plurality of IO pins programmably (e.g., by switch matrix or FPGA) coupled to a DUT connector or interface on the DUT Interface Board (test setup) 8 comprising a second plurality of IO pins at step 111 wherein said second plurality of IO pins selectively electrically interface with a third plurality of DUT 4 IO elements. At step 113, coupling the first plurality of IO pins of the Tester 3 to the second plurality of I/O pins of the DUT connector or interface on the DUT Interface Board (test setup) 8 without a DUT 4 installed therein. At step 115, one, all, or some of Tester pins (n) or IOs on Tester 3 selectively coupled to DUT IOs or pins (first plurality of IO pins) are placed in a high impedance state. In this example, at step 113, one, all or some Tester pins (n) or IOs on Tester 3 that are selectively coupled to DUT's IO pins or elements using a switch matrix, e.g., with Field Programmable Gate Array (FPGA) configuration settings, are placed in a high impedance state. At step 117, a first Tester 3 IO pin (programmably connected to a first DUT connector or interface IO pin) of said first plurality of IO pins is configured as tester output driving logic high by, e.g. FPGA configuration settings. At step 119, the first Tester 3 IO pin is configured in a high impedance state for a shortest increment possible (this begins RC delay from DUT IO pin), e.g., by FPGA configuration settings, by applying a voltage then disconnecting the voltage supply and allowing the voltage on the pin to dissipate. At step 121, the first tester IO pin is configured as a tester input sampling at a highest reliable sample rate (e.g., 80 MHz to 320 MHz can be typical in FPGA based test system) and a first sample count recorded; e.g., by FPGA configuration settings. At step 123, during execution of steps 119 and 123, the first tester IO pin is continually sampled and incrementing the first sample count number until a logic low is recorded (e.g., logic low is typically recorded when selected tester pin (e.g., first Tester 3 IO pin) is less than 50% of logic high value, e.g. if logic high is set to 3V, sample count until 1.5V). More generally, in one example, step 123 can include, e.g., charging a selected pin, removing charge, and sampling while counting the samples per unit time and allowing pin charge dissipate over time until a predetermined logic (1 or 0 or voltage above threshold) value is detected and converting the first sample count number back to a measure of time. At step 125, the first sample count number is saved in a non-transitory computer storage readable medium 7 for use in future comparison after logic low is detected or recorded. At step 127, steps 115 to 125 are repeated until all tester IO pins connected to DUT IO pins have been characterized and a plurality of sets of first sample counts saved associated with each DUT IO pins. At step 129, steps 115 to 127 are repeated a desired number of times to determine a range of counts for each tester IO and DUT IO pin pair which will represent an open circuit between the tester IO and the DUT IO pin pair based on a significant difference between sample count for a known bad connection (e.g., without DUT 4 inserted) and a test on a pair without a known bad connection.

Figure 4:
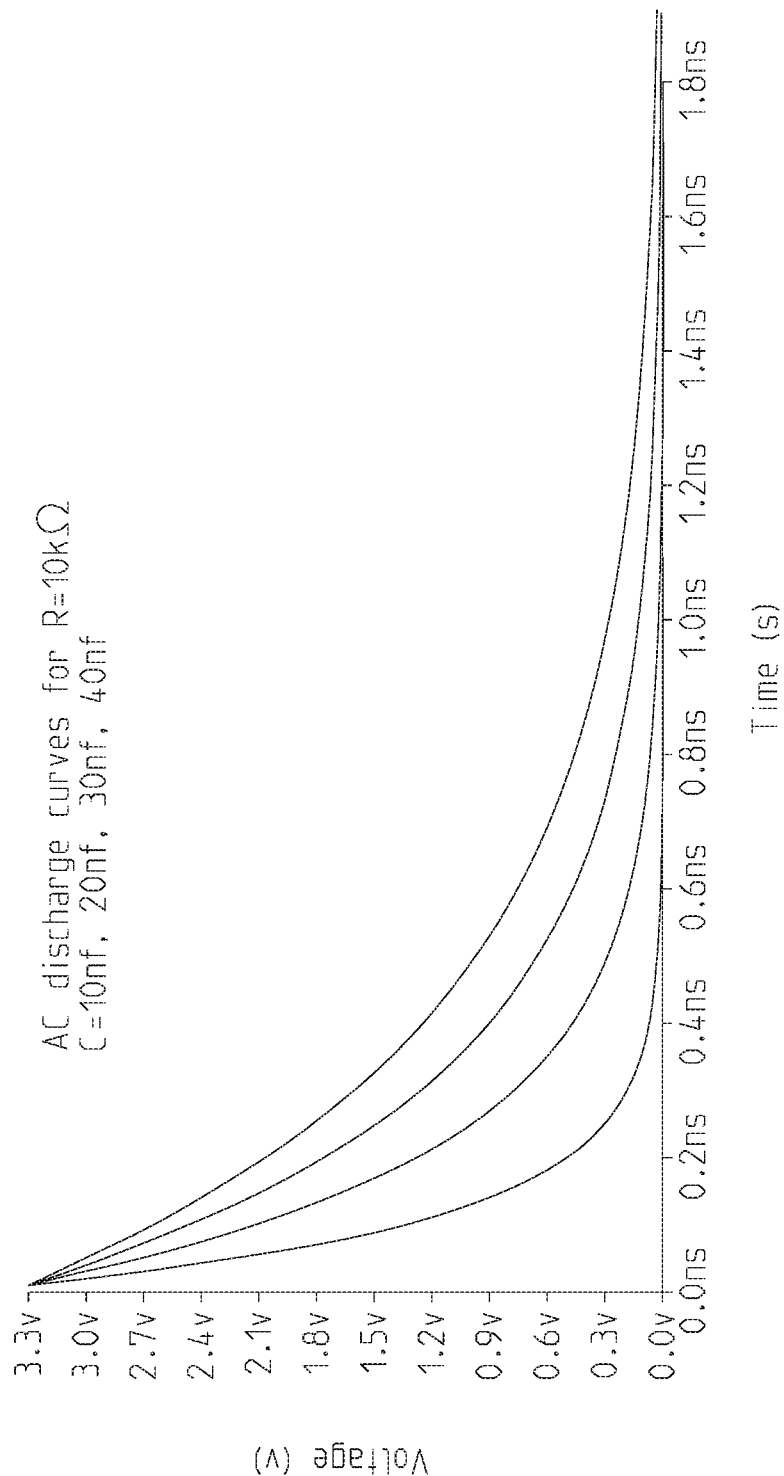
FIG. 4 shows an example of variance in RC delay curves for 10 nF, 20 nF, 30 nF, 40 nF capacitances to demonstrate effect of added DUT capacitance on tester IO structures in accordance with one embodiment of the invention.

Referring to FIG. 3*b*, at step 131, a DUT 4 is inserted into DUT Interface Board (test setup) 8. At step 133, steps 115 to 125 are repeated with DUT 4 inserted into the DUT Interface Board (test setup 8) to generate a second sample count number which should be compared with the first sample count number for each DUT IO to determine if the sample count has been affected by the present of DUT 4 in DUT Interface Board (test setup) 8. At step 137, an affected sample count (e.g. a lower sample count from the test setup assembly with DUT 4 inserted compared to the known bad connection) indicates either a good connection or a short is likely, wherein a decay of the RC delay curve will occur quickly over time, a good connection or a short indicates the second method using TDR should be applied to identify open circuits. At step 139, an unaffected sample count indicates an open circuit in the DUT continuity wherein a decay of the RC delay curve will occur more slowly over time as the second sample count is greater than the first count. FIG. 4 shows sample RC delay curves in accordance with a method such as described above.

Referring to FIGS. 5*a* and 5*b*, a method of identifying open circuits using TDR in accordance with an embodiment of the invention is shown. At step 301, exemplary method comprises providing a Testing System 10 (e.g., as in FIG. 1) including a Tester 3 comprising a first plurality of IO pins, a DUT Interface Board (test setup) 8 comprising a second plurality of IO pins on a DUT connector or interface configured to selectively receive and interface with a third plurality of IO pins on a DUT 4 that are programmably coupled to the first plurality of IO pins by the Tester 3 at step 201. At step 203, placing all of said first plurality of Tester 3 IO pins (n) in a high impedance state without the DUT 4 coupled to said DUT connector or interface. At step 205, Tester 3 configures a first Tester 3 IO pin of the first plurality IO pins (connected to a first DUT connector or interface IO pin of the second plurality of IO pins) as a Tester 3 output driving logic high, e.g. 3V. At step 207, Tester 3 configures the first Tester 3 IO pin of the first plurality of IO pins as tester output driving logic low to introduce a negative edge signal, e.g. 0 V. At step 209, Tester 3 configures the first tester IO pin in a high-impedance state for a predetermined time increment (e.g., shortest time increment possible); e.g. 3V. At step 211, the first tester IO pin is configured as tester input sampling at highest reliable sample rate and a first sample count is recorded in non-transitory computer storage readable medium 7. At step 213, during steps 209 and 211, the first tester IO pin is continually sampled at a predetermined sample rate (e.g., a highest reliable sample rate) for a predetermined time period (e.g., enough time for reflection to propagate from Tester 3 to DUT 4 and back to Tester 3 one or more times based on detecting an increased voltage after time zero) to generate a first plurality of samples. At step 215, storing the first plurality of samples sample values into non-transitory computer storage readable medium 7 for future comparison. At step 217, repeat steps 205 to 215 until all Tester 3 IO pins (e.g., first plurality of IO pins) connected to DUT 4 IO pins (e.g., third plurality of IO pins) have been characterized and store additional first plurality of sample values in a non-transitory computer storage readable medium 7. At step 219, repeat steps 205 to 217 a predetermined number of times to determine a range of the first plurality of samples for each Tester 3 IO pin (e.g., first plurality of IO pins) and DUT 4 IO pin (e.g., third plurality of IP pins) pair which will represent an open circuit between the tester IO and the DUT IO pin pair. At step 221, insert DUT 4 into DUT Interface Board (test setup) 8 and steps 205 to 217 are repeated to create a second plurality of samples. At step 223, compare the first and second plurality of sample values for each tester IO and DUT IO pin pair to determine if the presence of DUT 4 has changed a recorded pattern for each pair. If presence of DUT 4 has changed one or more of the recorded pattern of a respective said pair and there are more '1' values recorded, then an open circuit in DUT continuity is detected and DUT 4 should be reseated and this method should be repeated. If presence of DUT 4 has changed a recorded pattern for one or more of each pair and there are less '1' values recorded, then either a short or good connection is likely on such a pair, and the method in FIGS. 7*a-b* should be applied next. If presence of DUT 4 has not changed a recorded pattern for one or more of each pair and the recorded pattern includes '1' values, an open circuit in DUT continuity is likely and the DUT 4 should be reseated and this method should be repeated. If presence of DUT 4 has not changed a recorded pattern for one or more of each pair and the recorded pattern does not include '1' values, either a short or good connection is likely and the method in FIGS. 7*a-b* should be applied.

Figure 6:
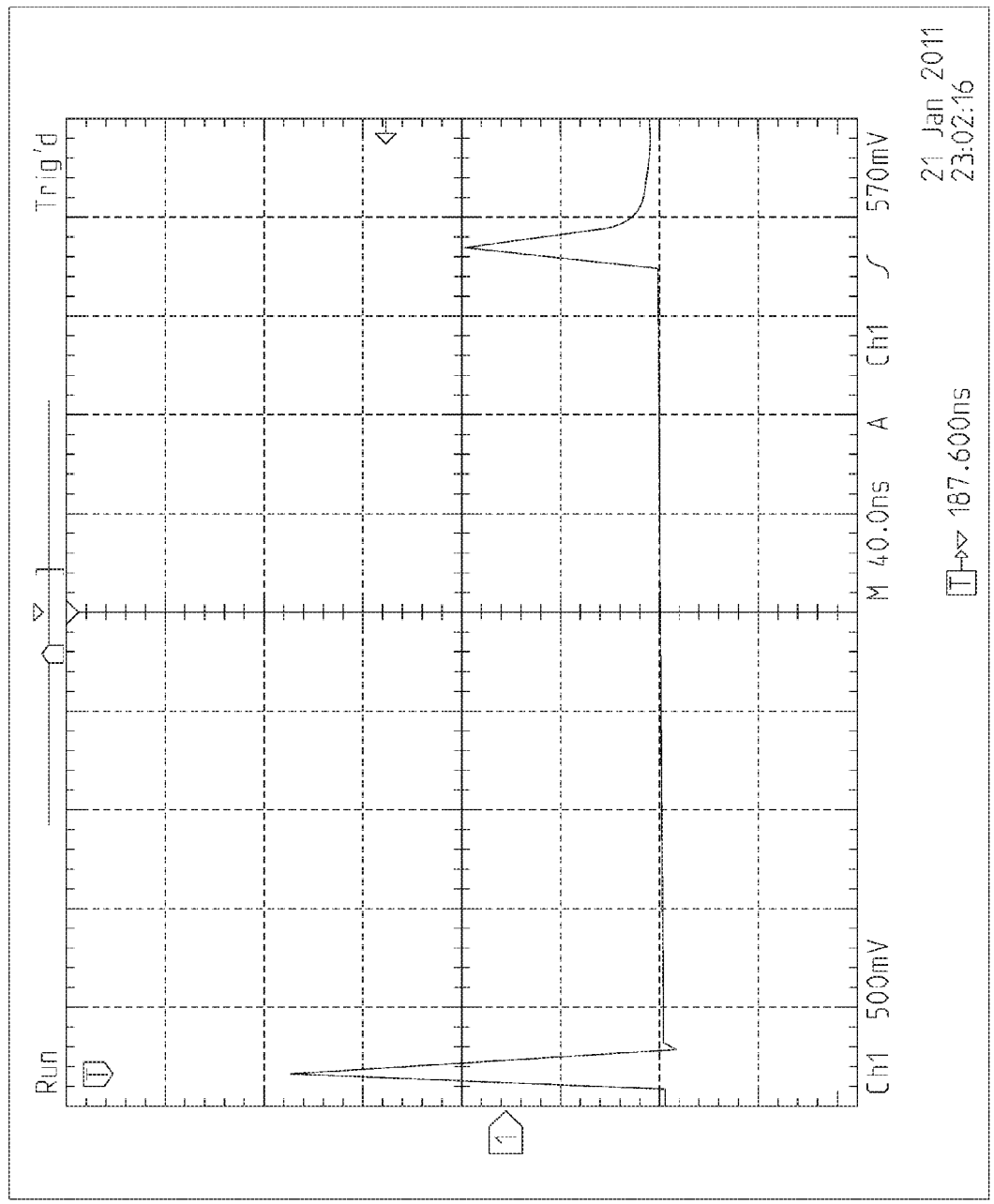
FIG. 6 shows an example of reflection caused by an open circuit in accordance with an embodiment of the invention.

FIG. 6 shows an exemplary output graph for TDR testing in accordance with the FIG. 5 method.

Referring to FIGS. 7*a-b*, a method 13 of identifying short circuits by forcing voltage on a single pin while measuring voltage on remaining pins in accordance with an embodiment of the invention. At step 301, providing a Test System 10 (e.g., as in FIG. 1) comprising a control section and a first plurality of IO pins and a DUT Interface Board (test setup) 8 comprising a DUT Interface or connector comprising a second plurality of IO pins then inserting a DUT 4 comprising a third plurality of IO pins into the DUT interface or connector wherein the Tester 8 programmably couples the first and second plurality of IO pins. At step 303, once DUT 4 is inserted into the DUT interface or connector on the DUT Interface Board (test setup) 8, all Tester 3 IO pins (e.g., first plurality of IO pins) are configured as tester output driving low to discharge all the Tester 3 IO pins. At step 305, place all Tester 3 IO pins (n) (e.g., first plurality of IO pins) on Tester 3 in a high-impedance state. At step 307, Configure a first Tester 3 IO pin of said first plurality of IO pins that is connected to a first DUT interface or connector IO pin of said second plurality of IO pins as tester output driving logic high. At step 309, configure a next adjacent said Tester 3 IO pin of said first plurality of IO pins as a tester input sampling at a predetermined sample rate (e.g., a highest reliable sample rate) and record one of a first plurality of sample values of pin driven high and pin sampled in a non-transitory computer storage readable medium 7. At step 311, repeat step 309 for each adjacent said Tester 3 IO pin of said first plurality of IO pins and generate additional first plurality of sample values respective to each adjacent Tester 3 IO pin of said first plurality of IO pins. At step 313, repeat steps 301 to 311 until all adjacent Tester 3 IO pins of said first plurality of IP pins connected to the DUT interface connector IO pins (e.g., the second plurality of IO pins) have been sampled, characterized and respective ones of said first plurality of data has been recorded in non-transitory computer storage readable medium 7, said recorded values comprising a "1" or "0" representing a voltage above and below a voltage threshold. At step 315, if any said adjacent first plurality of pins have recorded '1' values, a likely short circuit in DUT 4 continuity has been detected and the DUT 4 should be reseated in the DUT interface or connector of the DUT Interface Board (test setup) 8 and method in FIGS. 3a and 3b repeated. At step 317, if one or more said adjacent first plurality of IO pins programmably coupled to said second and third plurality of IO pins respectively have no recorded '1' values, either a good or open connection is likely and no errors in DUT 4 continuity were found.

Figure 8:
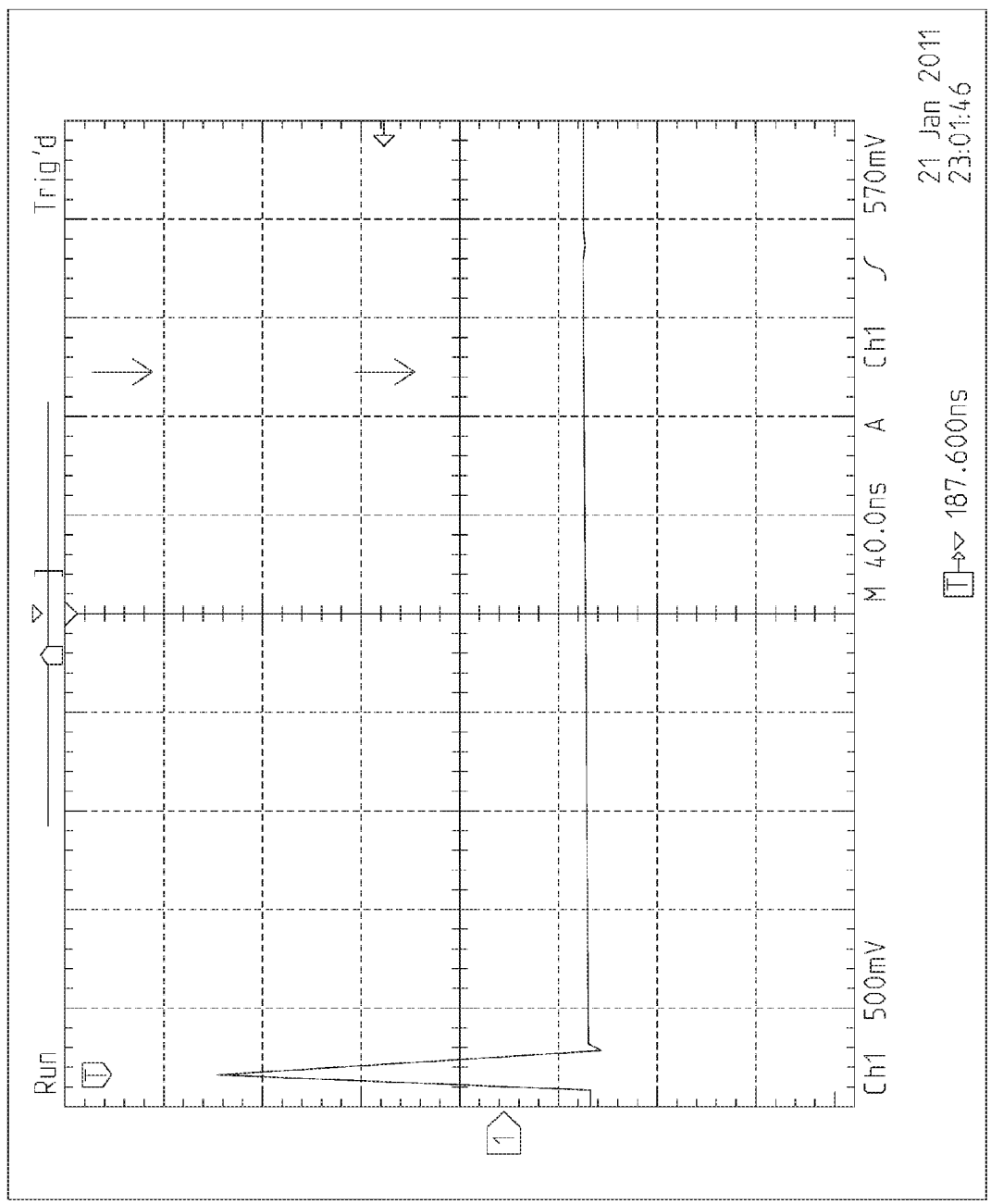
FIG. 8 shows an example of no reflection caused by presence of DUT in accordance with an embodiment of the invention.
Figure 9:
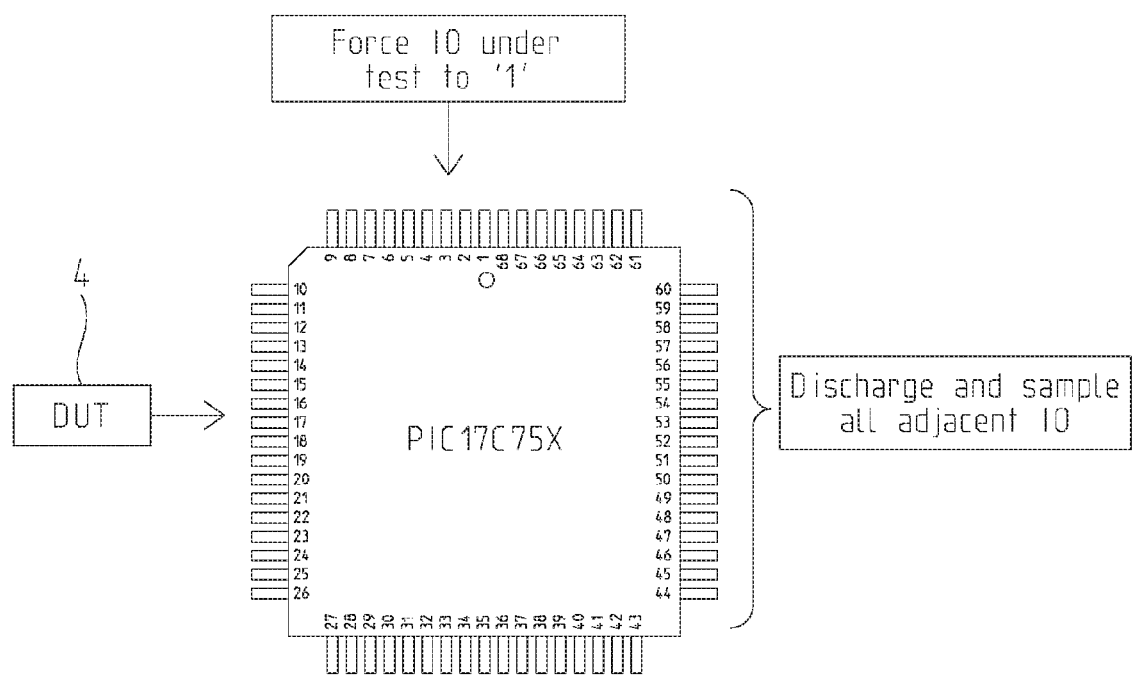
FIG. 9 shows an example of holding a single DUT IO at '1' while sampling adjacent DUT IO in accordance with one embodiment of the invention.
Figure 10:
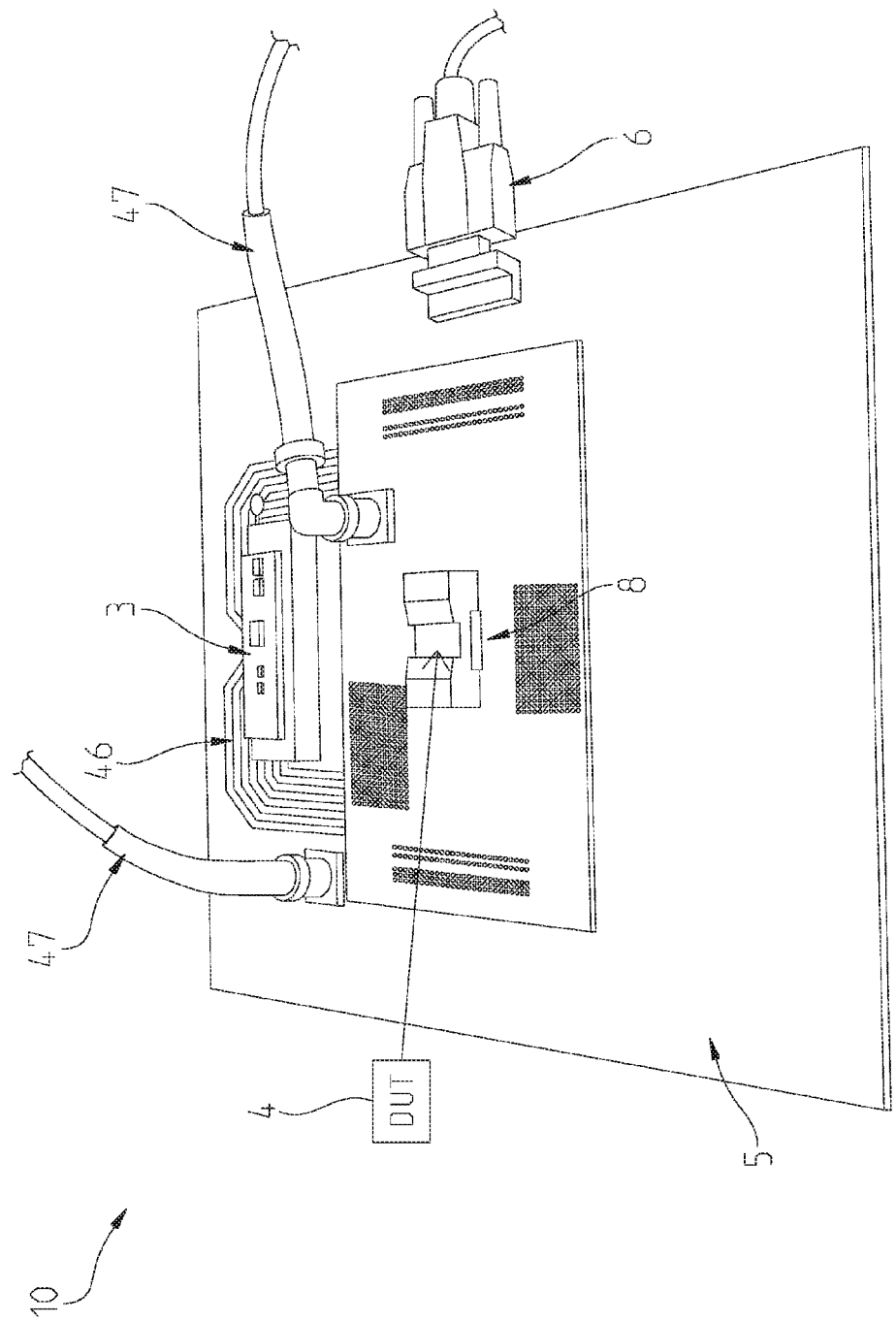
FIG. 10 shows a close up image of a DUT Board in an exemplary testing system setup.

FIG. 8 shows an example of no reflection in the exemplary FIGS. 7a-b method caused by a presence of DUT 4 in accordance with an embodiment of the invention. FIG. 9 shows an example of holding a single DUT IO at '1' while sampling adjacent DUT IO in accordance with method 13 and one embodiment of the invention Referring to FIG. 10, a close up of a Test System 10 configured to test and report on, e.g., continuity of a DUT 4 is shown. An exemplary embodiment includes a DUT Adapter Board 5 coupled with a Tester 3, a DUT 4 placed into a socket in a DUT Interface Board (test setup) 8 connected to the DUT Adapter Board 5. Tester 3 is connected to DUT 4 by electrical connections 46. Cables 47 supply power to Test System 10 from power supply (not shown) and are connected to DUT Adapter Board 5. An RS-232 PC connection 6 is also coupled to DUT Adapter Board 5 and transmits output information from DUT Adapter Board 5 to a testing interface computer 2 (not shown).

Figure 11:
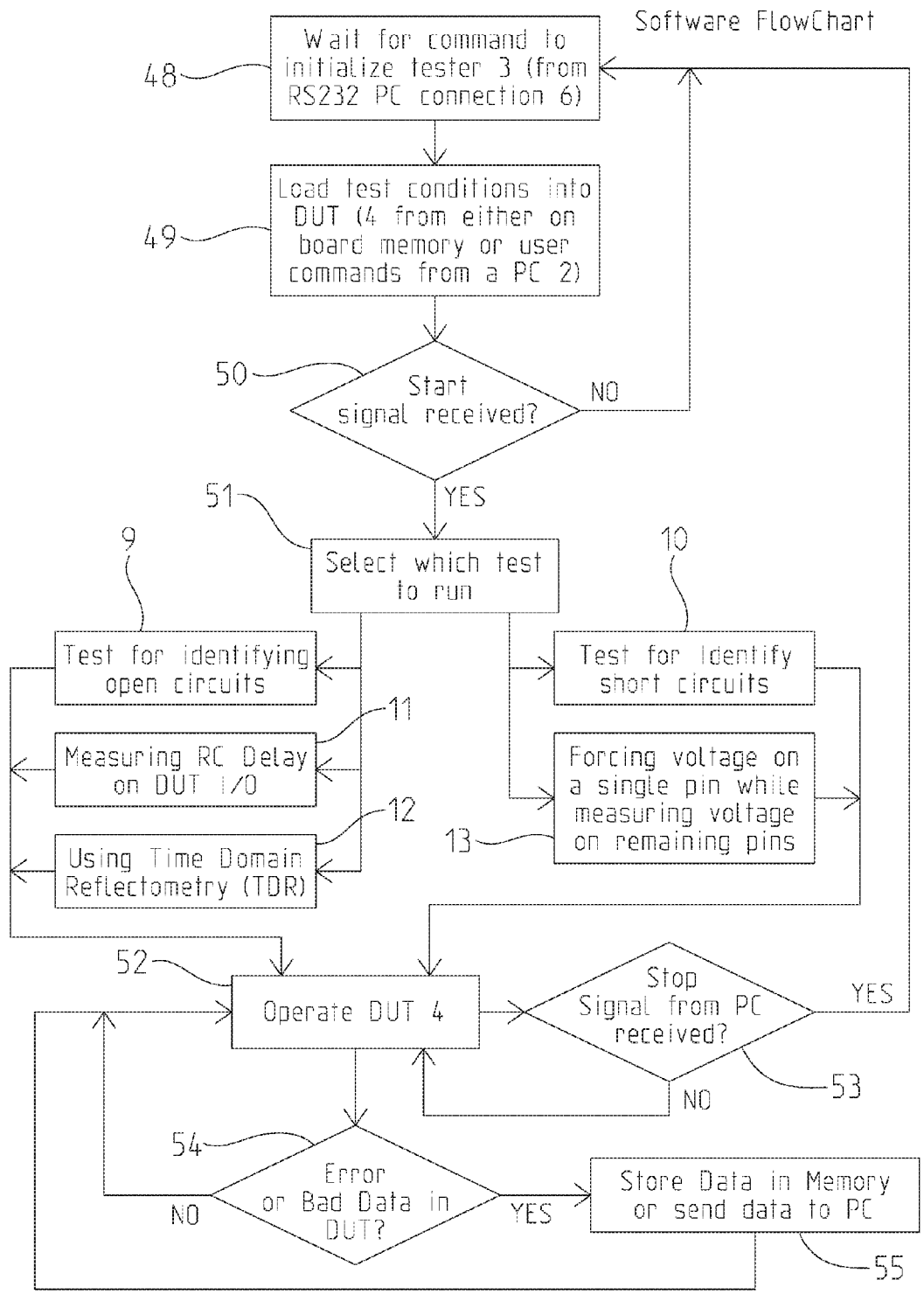
FIG. 11 shows a flowchart of an exemplary process for running software for the DUT continuity test.

Referring to FIG. 11, a flowchart shows an exemplary process for running software for DUT continuity test. At step 48, tester 3 is initialized from RS2332 PC connection 6. At step 49, test conditions are loaded into DUT 4 from either on board memory or user commands from a PC 2. If a start signal 50 is not received then go back to step 48 and wait for command to initialize tester 3 again. If a start signal 50 is received, then at step 51, a test is selected from a list of tests for identifying open circuits 9 or a list for identifying short circuits 10. Once a test is selected, at step 52, DUT 4 is operated. If a stop signal from PC 2 is received, then proceed to step 48 and wait for command to initialize tester 3. If a stop signal from PC 53 is not received then continue to operate DUT 4 at step 52. If an error or bad data 54 appears in DUT 4 then store data in memory or send data to PC 2 according to step 55, and then return to operate DUT 4 at step 52. If an error or bad data 54 does not appear in DUT 4 then return to operate DUT 4 at step 52.

Although the invention has been described in detail with reference to certain preferred embodiments, variations and modifications exist within the spirit and scope of the invention as described and defined in the following claims.

The invention claimed is:

1. A system to identify open or short circuits in at least a device under test (DUT) comprising:
 a non-transitory machine readable medium storing a plurality of non-transitory machine readable instructions adapted to operate a computer and control equipment connected to said computer to identify open or short circuits in at least said DUT comprising:
  a first plurality of non-transitory machine readable processing sequences comprising a first plurality of machine readable instructions to operate an electrical signal measuring section to produce one or more first category resistor-capacitor (RC) delay measurements on one or more circuits associated with one or more device under test (DUT) input/output (I/O) elements to determine if said circuit associated with said DUT is an open circuit based on said one or more first category RC delay measurements, wherein said first plurality of machine readable instructions further determine if said one or more circuits is a closed circuit based on said one or more first RC delay measurements;
  a second plurality of non-transitory machine readable processing sequences comprising instructions to operate said electrical signal measuring section to determine if said circuit associated with said DUT is an open circuit based on one or more first category measured values obtained based on time domain reflectometry (TDR) associated with at least one of said DUT I/O elements; and
  a third plurality of non-transitory machine readable processing sequence comprising instructions to operate said electrical signal measuring section to determine if said circuit associated with said DUT has a short circuit by applying voltage on said I/O element while measuring voltage on other I/O elements of said circuit of said DUT.

2. The system of claim 1:
 wherein said first plurality of non-transitory machine readable processing sequences further comprises instructions to obtain and compare one or more second category RC delay measurements and said one or more first category RC delay measurements, wherein said one or more second category RC delay measurements are associated with at least one socket I/O circuit of a socket operable to receive said DUT without one or more said DUT I/O elements in contact with the at least one socket I/O circuit, wherein at least some of said one or more first category RC delay measurements are further associated with said at least one said socket I/O circuit of the socket with at least some of said one or more said DUT I/O elements emplaced within or electrically coupled said socket.

3. The system of claim 1:
 wherein said second plurality of non-transitory machine readable processing sequences further comprises instructions to obtain and compare one or more second category measured values based on TDR with said one or more first category measured values based on TDR, wherein said one or more second category measured values based on TDR are determined by sending signals through one or more socket I/O elements of a socket operable to receive said DUT without said DUT I/O elements being coupled with said socket I/O elements, wherein said one or more first category of measured values based on TDR is determined by sending signals through said one or more socket I/O elements of said socket with said DUT elements being coupled with said socket I/O elements.

4. The system of claim 1:
wherein said third plurality of non-transitory machine readable processing sequences further comprises instructions to determine if any adjacent pins of said DUT has a recorded value of '1';
wherein if any said adjacent pins have recorded values of '1' then a likely short circuit in DUT continuity has been detected.

5. A method for identifying open circuits by measuring RC delays on a DUT TO comprising:
providing a test setup comprising a tester coupled to a DUT board;
ensuring said tester is coupled to said DUT board without a DUT;
placing all tester pins on said tester in a high impedance state;
configuring a first tester I/O pin connected to a DUT TO pin as tester output driving logic high;
wherein said configuring step further comprises configuring said first tester I/O pin in a high impedance state for shortest increment possible;
configuring said first tester I/O pin as a tester input sampling a highest reliable sample rate and recording a first sample count associated with said test setup without a DUT;
continually sampling said first tester I/O pin during said configuring steps until a logic low is recorded;
recording said first sample count in a non-transitory computer storage readable medium;
saving said first sample count in said non-transitory computer storage readable medium for use in future comparison when logic low is recorded;
repeating said placing, configuring, recording, and saving steps until all tester I/O pins connected to said DUT I/O pin have been characterized and sample counts saved;
inserting a DUT into said test setup;
repeating said placing, configuring, recording, and saving steps generating a second sample count associated with said DUT that is inserted into said test setup; and
comparing said first sample count and said second sample count to determine if the presence of said DUT in said DUT board has created an affected sample count;
wherein said affected sample count comprises a difference between said first sample count and said second sample count.

6. The method of claim 5:
wherein said comparing step indicates said affected sample count;
said affected sample count indicates either a good connection or a short when a decay of an RC delay curve will occur quickly over time.

7. The method of claim 5:
wherein said comparing step does not create an affected sample count indicating an open circuit since a decay of an RC delay curve will occur more slowly over time.

8. A method of identifying short circuits by forcing voltage on a single pin comprising:
inserting a DUT into a test setup comprising a tester and a DUT board;
configuring all tester I/O pins as tester output driving logic low to discharge all pins;
placing all tester I/O pins on said tester in a high impedance state;
configuring a first tester I/O pin connected to a first DUT I/O pin as tester output driving logic high;
configuring a next adjacent tester I/O pin as a tester input sampling at a highest reliable sample rate generating a value of pin driven high and pin sampled;
recording said value in a non-transitory computer storage readable medium;
repeating said configuring and recording steps for each adjacent tester I/O pin; and
repeating said configuring, recording, and repeating steps until all tester I/O pins connected to DUT I/O pins have been characterized and data recorded in said non-transitory computer storage readable medium.

9. The method of claim 8:
wherein said recording step indicating said value of any adjacent pins as '1', a likely short circuit in continuity data of said DUT has been detected.

10. The method of claim 8:
wherein said recording step indicating no said value of adjacent pins as '1', either a good or open connection is likely and no error in continuity data of said DUT was found.

11. A test system operable to determine a short, open, or electrical connections digitally in a device under test (DUT) continuity test, comprising:
a first, second and third section configured to respectively apply a first, second and third test in a first sequence on at least one input and output (TO) section of a DUT and determine if at least one IO has a short, open or electrical connection;
wherein said first section is configured for identifying one or more said open circuit by applying a plurality of first inputs on and measuring resistance-capacitance (RC) delay on said at least one IO;
wherein said second section is configured for identifying one or more said open circuits using time domain reflectometry (TDR) on the at least one IO section;
wherein said third section is configured for identifying one or more said short circuits by forcing voltage on a plurality of said IO sections of said DUT while measuring voltage on remaining pins to determine if said voltage is above or below a predetermined threshold associated with at least one logic value.

12. A method for identifying open and short circuits in at least a device under test (DUT) by a combination of testing methods comprising:
providing a test setup comprising an electrical signal tester coupled to a DUT testing interface board;
executing at least two of a plurality of said testing methods on said DUT including forcing voltage, measuring resistance/capacitance (RC) delays, and time domain reflectometry (TDR) with respect to said DUT;
wherein said forcing voltage testing operations on said DUT comprises:
ensuring said electrical signal tester is coupled to said DUT board without a DUT;
placing all tester pins on said electrical signal tester in a high impedance state;
performing a first plurality of configuring steps comprising configuring a first tester I/O pin connected to one or more DUT IO pin as tester output driving logic high;
wherein said first plurality of configuring steps comprises configuring said first tester I/O pin in a high impedance state for shortest increment possible;
configuring said first tester I/O pin as a first tester input sampling a highest reliable sample rate and recording a first sample count associated with said DUT testing interface board without said DUT installed;

continually sampling said first tester I/O pin during said configuring steps until a logic low is recorded;

recording said first sample count in a non-transitory computer storage readable medium;

saving said first sample count in said non-transitory computer storage readable medium for use in future comparison when logic low is recorded;

repeating said placing, configuring, recording, and saving steps until all tester I/O pins connected to said DUT I/O pin have been characterized and sample counts saved;

inserting said DUT into said DUT testing interface board;

repeating said placing, configuring, recording, and saving steps generating a second sample count associated with said DUT that is inserted into said DUT testing interface board; and comparing said first sample count and said second sample count to determine if the presence of said DUT in said DUT testing interface board has created an affected sample count;

wherein said affected sample count comprises a difference between said first sample count and said second sample count;

wherein said measuring resistance/capacitance (RC) delays method comprises:

executing an RC delay sampling process comprising placing all said tester pins on said electrical signal tester in a high impedance state, configuring said first tester I/O pin connected to said first DUT I/O pin as a second tester output driving logic high, configuring said first tester I/O pin as a tester output logic low to introduce a negative edge signal, configuring said first tester I/O pin in a high impedance state, configuring said first tester I/O pin as tester input sampling a highest reliable sample rate generating a first plurality of RC delay method sample counts, recording said first plurality of RC delay method sample counts in said non-transitory computer storage readable medium, and continually sampling said first tester I/O pin during prior two configuring and recording steps at highest reliable sample rate for up to a predetermined time for reflection to propagate from said tester to said DUT and back to said electrical signal tester, wherein said RC delay related sampling steps are based on detecting an increased voltage after time zero to generate at least in part generation of said first plurality of RC delay related sample values;

storing additional said first plurality of RC delay related sample values into said non-transitory computer storage readable medium;

repeating said RC delay sampling steps comprising configuring, sampling, and storing steps until all tester I/O pins connected to DUT I/O pins have been characterized and additional said first plurality of RC delay related sample values for each separate DUT I/O pins stored in said non-transitory computer storage readable medium;

repeating said RC delay sampling steps comprising configuring, sampling, storing and prior repeating steps a predetermined number of times to determine a range of respective RC delay related sample values for each tester I/O and DUT I/O pin pair which represents an open circuit between said tester I/O and DUT I/O pin pair;

inserting said DUT into a DUT socket of said testing interface board;

repeating said RC delay sampling steps comprising configuring, sampling and storing steps generating a second plurality of RC delay related sample values for each tester I/O and DUT I/O pin pair;

comparing said second plurality of RC delay related values with respective said first plurality of RC delay related sample values to determine if insertion of said DUT into said testing interface board has changed a recorded pattern of at least one of said second RC delay related sample value for each tester I/O and DUT I/O pin pair;

wherein said time domain reflectometry (TDR) method comprises using said electrical signal tester to determine if a circuit associated with said DUT I/O pin pairs exhibit an open circuit indication based on one or more first category measured values obtained based on TDR associated with at least one of said DUT I/O pin pairs.

13. The method of claim 12, wherein said comparing of said second plurality of RC delay related values with respective said first plurality of RC delay related sample values is used to determine a good connection or a short circuit status data or identifier associated with each comparison since a decay of a first RC delay curve will happen at a first rate of decay over a first time period, wherein said comparing of said second plurality of RC delay related values with respective said first plurality of RC delay related sample values is used to determine an open circuit since a decay of a second RC delay curve will occur at a second rate of decay over said first time period, wherein said first rate of decay is greater or faster than said second rate of decay.

14. The method of claim 12, wherein said comparing step indicating that the presence of said DUT has changed said recorded pattern for each tester I/O and DUT I/O pin pair and said recorded pattern includes more '1' values recorded, then an open circuit in the continuity data of said DUT is detected.

15. The method of claim 12, wherein said comparing of said first sample count and said second sample count indicating that presence of said DUT in said DUT socket has changed said recorded pattern for each tester I/O and DUT I/O pin pair and said recorded pattern includes less '1' values recorded, then either a short or good connection is detected in the continuity data of said DUT.

16. The method of claim 12, wherein said comparing of said first sample count and said second sample count indicating that presence of said DUT in said DUT socket has not changed said recorded pattern for each tester I/O and DUT I/O pin pair and said recorded pattern includes '1' values, then an open circuit in DUT continuity is likely.

17. The method of claim 12, wherein said comparing of said first sample count and said second sample count indicating that presence of said DUT has not changed said recorded pattern for each tester I/O and DUT I/O pin pair and said recorded pattern does not include '1' values, then either a short or good connection is likely.

* * * * *